United States Patent
Pedersen (10) Patent No.: US 7,451,367 B2
(45) Date of Patent: Nov. 11, 2008

(54) ACCESSING SEQUENTIAL DATA IN MICROCONTROLLERS

(75) Inventor: Frode Milch Pedersen, Trondheim (NO)

(73) Assignee: ATMEL Corporation, San Jose, CA (US)

(*) Notice: Subject to any disclaimer, the term of this patent is extended or adjusted under 35 U.S.C. 154(b) by 192 days.

(21) Appl. No.: 11/354,261

(22) Filed: Feb. 14, 2006

(65) Prior Publication Data

US 2007/0208967 A1 Sep. 6, 2007

(51) Int. Cl.
G11C 29/00 (2006.01)
(52) U.S. Cl. .................................. 714/718
(58) Field of Classification Search ............... 714/718, 714/724
See application file for complete search history.

(56) References Cited

U.S. PATENT DOCUMENTS

| | | | |
|---|---|---|---|
| 5,297,148 A | 3/1994 | Harari et al. | |
| 5,590,354 A | 12/1996 | Klapproth et al. | |
| 5,761,215 A * | 6/1998 | McCarthy et al. | 714/726 |
| 6,041,378 A * | 3/2000 | Warren | 710/307 |
| 6,041,406 A * | 3/2000 | Mann | 712/227 |
| 6,076,177 A | 6/2000 | Fontenot et al. | |
| 6,243,842 B1 * | 6/2001 | Slezak et al. | 714/724 |
| 6,493,839 B1 * | 12/2002 | Miner | 714/718 |
| 6,530,047 B1 | 3/2003 | Edwards et al. | |
| 6,543,019 B2 * | 4/2003 | Kniffler et al. | 714/733 |
| 6,567,932 B2 | 5/2003 | Edwards et al. | |
| 6,591,369 B1 | 7/2003 | Edwards et al. | |
| 6,601,189 B1 | 7/2003 | Edwards et al. | |
| 6,665,816 B1 | 12/2003 | Edwards et al. | |
| 6,754,868 B2 * | 6/2004 | Bristow et al. | 714/744 |
| 6,779,145 B1 | 8/2004 | Edwards et al. | |
| 6,925,583 B1 * | 8/2005 | Khu et al. | 714/30 |
| 6,948,147 B1 * | 9/2005 | New et al. | 716/16 |
| 7,340,658 B2 * | 3/2008 | Seuring | 714/726 |
| 2007/0192657 A1 | 8/2007 | Laurent et al. | |

FOREIGN PATENT DOCUMENTS

| JP | 10135819 | 5/1998 |
|---|---|---|
| JP | 2003317490 | 11/2003 |

OTHER PUBLICATIONS

"IEEE Standard Test Access Port and Boundary-Scan Architecture" IEEE Std 1149.1-2001 (Revision of IEEE Std 1149.1-1990) 208 pages.
Non-final Office Action, mailed Apr. 4, 2008, U.S. Appl. No. 11/353,873, 18 pages.

* cited by examiner

Primary Examiner—James C Kerveros
(74) Attorney, Agent, or Firm—Fish & Richardson P.C.

(57) ABSTRACT

A system and method for executing a sequential data memory access through a serial access port is provided. The system may include a memory access controller to receive a block access command and successively access data elements in the block. In certain implementations, a test device, such as a JTAG host, transmits a block read or write command specifying a start address and an increment value to an embedded device under test, whereupon a memory access controller in the embedded device sequentially accesses the data at the start address, increments the address by the increment value, accesses the data at the incremented address, and repeats this procedure to sequentially access each of the remaining data elements in the block.

23 Claims, 7 Drawing Sheets

ACCESSING SEQUENTIAL DATA IN MICROCONTROLLERS

BACKGROUND

Advances in surface mount technology and printed circuit (PC) board manufacture have resulted in more complex and smaller PC boards that have higher integrated circuit (IC) density. Surface mount devices (SMDs) or very large-scale integrated (VLSI) circuits often have minimal spacing between pins. SMDs may be now mounted to both sides of the PC board.

"Contact" test methods for such devices (in which the test fixture directly contacts the pins or other electrical contacts on the board), have become correspondingly more complex and costly. In order to test certain devices with higher pin pitches, some test fixtures are configured with smaller probe tips or alternate electrical contact apparatus. Similarly, testing devices having ICs mounted on both sides of the PC board has sometimes required substantial modification of pre-existing text fixtures.

In 1990, the Institute of Electrical and Electronic Engineers (IEEE) adopted a standard for a non-contact method of testing PC boards. According to the 1149.1 standard, also known as the IEEE Standard Test Access Port and Boundary Scan Architecture, logic can be incorporated into an IC that may allow for test methods that may include in-circuit testing of an IC itself, interconnection testing of interconnections between ICs in an assembled PC board, and operational testing for observing and modifying of circuit activity during normal operation. The test logic may allow software to control and observe boundary scan cells electronically during test or normal operation. A boundary scan cell may be located adjacent to each IC pin so that signals at the IC boundaries can be controlled and observed. Each boundary scan cell may include a shift register stage. The boundary scan cells may allow test data to be electronically placed on an output pin or to be observed electronically on an input pin for an IC without the need for a physical probe. The boundary scan cells for the pins of an IC may be interconnected to form a shift register chain. The chain may include serial input and output connections and clock and control signals. The test data may be shifted serially into and out of boundary scan registers that can be connected on a bus within the IC. The boundary scan bus and other building blocks may be accessed through a Test Access Port (TAP).

In many conventional implementations, the TAP controls an interface between the boundary scan registers on the IC and the boundary scan bus. The TAP can be implemented as a state machine controlling the operations associated with the boundary scan cells. The TAP controller interface can be based on four ports. The Test Clock (TCK), Test Mode Select (TMS), Test Data In (TDI), and Test Data Out (TDO) ports may be used to control the basic operation of the TAP. The TCK and TMS ports may direct signals between TAP controller states. The TDI and TDO ports may receive the data input and output values serially from the boundary scan registers. An optional fifth port, Test Reset (TRST), may be implemented as an asynchronous reset signal to the TAP controller.

A serial protocol, such as Joint Test Action Group (JTAG) can be used to communicate with the TAP controller in certain implementations. A JTAG device, e.g., an external test device, can use the JTAG protocol to implement a full duplex serial synchronous protocol for communication with the TAP controller. A JTAG master, that forms part of the JTAG device, and TAP controller may include logic for accessing internal memory devices of a microcontroller, for example.

SUMMARY

A system for executing a sequential data memory access through a serial access port may include a memory access controller to receive a block access command and successively access data elements in the block. In certain implementations, a test device, such as a JTAG host, transmits a block read or write command specifying a start address and an increment value to an embedded device under test. Upon receipt, a memory access controller in the embedded device sequentially accesses the data at the start address, increments the address by the increment value, accesses the data at the incremented address, and repeats this procedure to sequentially access each of the remaining data elements in the block.

Particular embodiments of the invention can be implemented to realize one or more of the following advantages. First, a JTAG test device may need to send only a single memory access command to effectuate a read or write operation. Second, the JTAG test device may execute other test protocols while the memory access controller is sequentially accessing data elements in a block. Third, the total time required to subject a device under test to a test protocol may be substantially reduced.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION OF ILLUSTRATIVE EMBODIMENTS

Figure 1:
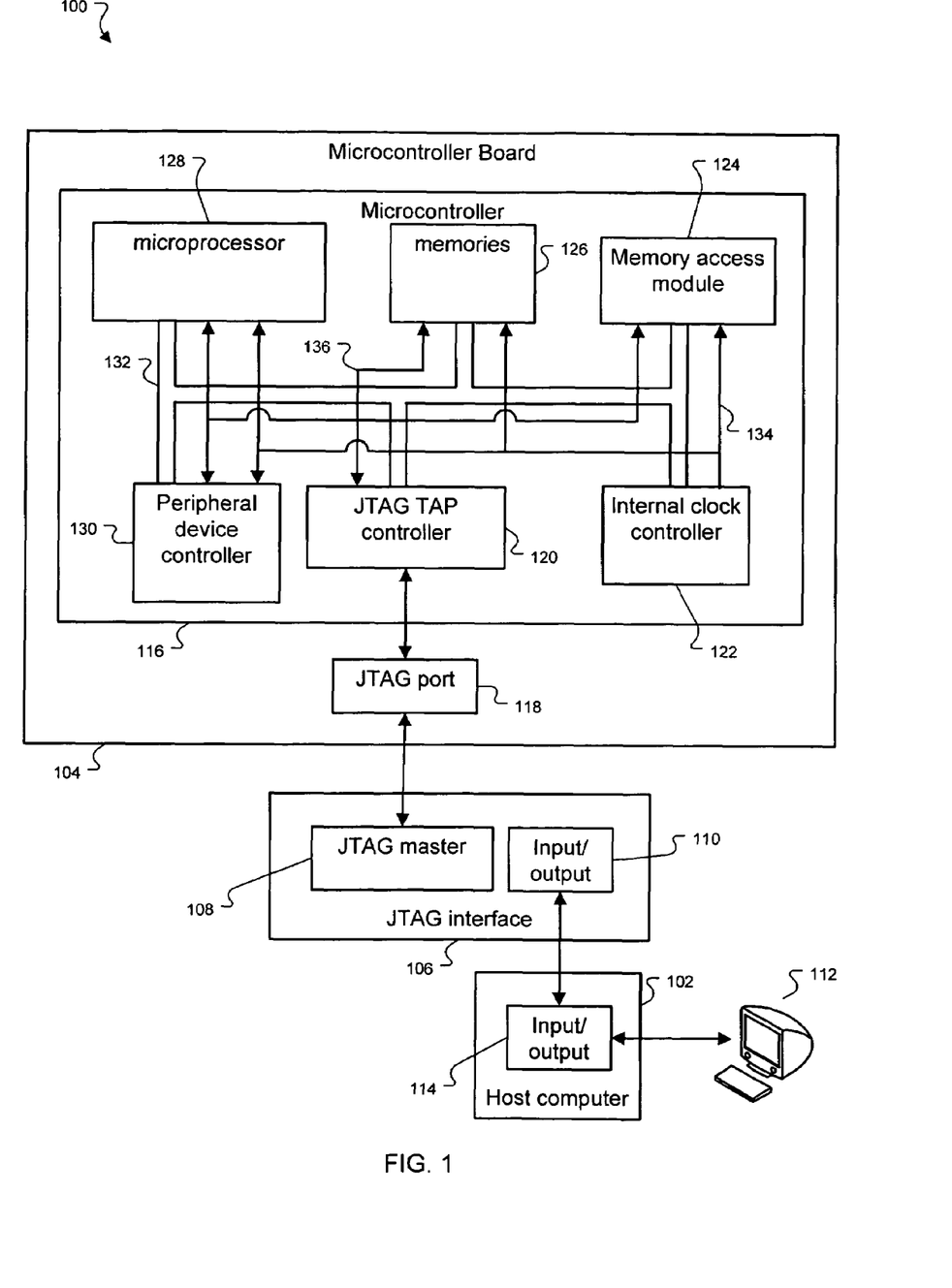
FIG. 1 is a block diagram of an exemplary computer system that accesses data in memory in a microcontroller.

FIG. 1 is a block diagram of an exemplary computer system that accesses data in embedded memories in a controller (e.g., a microcontroller). By way of example, reference will be made to a microcontroller configuration below. Those of ordinary skill in the art will recognize that the methods and systems disclosed have applicability to other embedded configuration devices. The computer system 100 includes a host computer 102 connected to a microcontroller board 104 by way of a JTAG interface 106. The JTAG interface 106 consists of a JTAG master 108 and an input/output port 110. A user by way of user device 112 connected into an input/output port 114 on the host computer 102 can operate the microcontroller board 104 by sending control information to the board by way of the input/output port 114 to an input/output port 110 on the JTAG interface 106. For example, a user may type in a command on the keyboard of user device 112 which will be processed by an application running on the host computer 102 resulting in an instruction being sent to the JTAG interface 106. The instruction is sent by way of input/output port 114 to input/output port 110 which may be a universal serial bus (USB) connection between the host computer 102 and the JTAG interface 106. In another implementation, the user device 112 and the host computer 102 may be one device consisting of a laptop computer.

The instruction received on the input/output port 110 may be sent to the JTAG master 108 for interpretation. The JTAG master 108, upon receiving the instruction, can interpret the instruction and determine the JTAG instructions and signals to be sent to the microcontroller board 104.

The microcontroller board 104 may include a microcontroller 116 and a JTAG port 118. The microcontroller 116, in this example, is a single IC that includes a JTAG TAP controller 120, an internal clock controller 122, a memory access module 124, memories 126, a microprocessor 128 and a peripheral device controller 130. Microcontroller 116 also can include a bus 132, an internal clock signal 134 and internal JTAG signals 136. The signals sent from the JTAG master 108 to the pins on the JTAG port 118 may include the JTAG clock (TCK), TDO, TDI and TMS. The signals on these pins can be received on corresponding inputs on the JTAG TAP controller 120. Optionally the TSRT signal may be sent.

The JTAG TAP controller 120 can process the instruction and data information it receives to determine the test interface to measure or control within the microcontroller. The state machine in the JTAG TAP controller 120, which will be described in more detail in FIG. 2, can control the operation of the JTAG TAP controller 120. The TDO and TDI signals can comprise the internal JTAG signals 136 which are connected to some or all of the circuits within the microcontroller. The internal clock controller 122 may include logic to generate the internal clock signal 134 which may be used by the modules contained within the microcontroller, with the exception of the JTAG TAP controller 120. The JTAG TAP controller 120 can use the TCK clock provided by the JTAG master 108. The microprocessor 128 can provide the core logic and control for the microcontroller 116 and may utilize the memories 126 for storage of its program instructions as well as data. The memories 126, for example, may include Electrically Erasable and Programmable Read Only Memory (EEPROMs) for instruction storage and dynamic Dynamic Random Access memory (DRAM) for data storage. In another example, the memories 126 may include Flash memory and Static Random Access Memory (SRAM).

The peripheral device controller 130 may include the logic for the microcontroller 116 to connect to and/or communicate with other devices. For example, the peripheral device controller 130 may contain logic for the microcontroller to connect to a digital signal processor allowing it the ability to process digital image data, for example, a color image from a digital camera. In this example, the digital image data may be received by the microcontroller by way of an input device connected to the peripheral device controller 130.

The memory access module 124 may include logic to allow for accessing of the memories 126 by the JTAG TAP controller 120. The bus 132 may include address and data bits that are propagated throughout the microcontroller 116 that can allow the core logic in the microprocessor 128 to access and control the other logic modules within the microcontroller 116.

Figure 2:
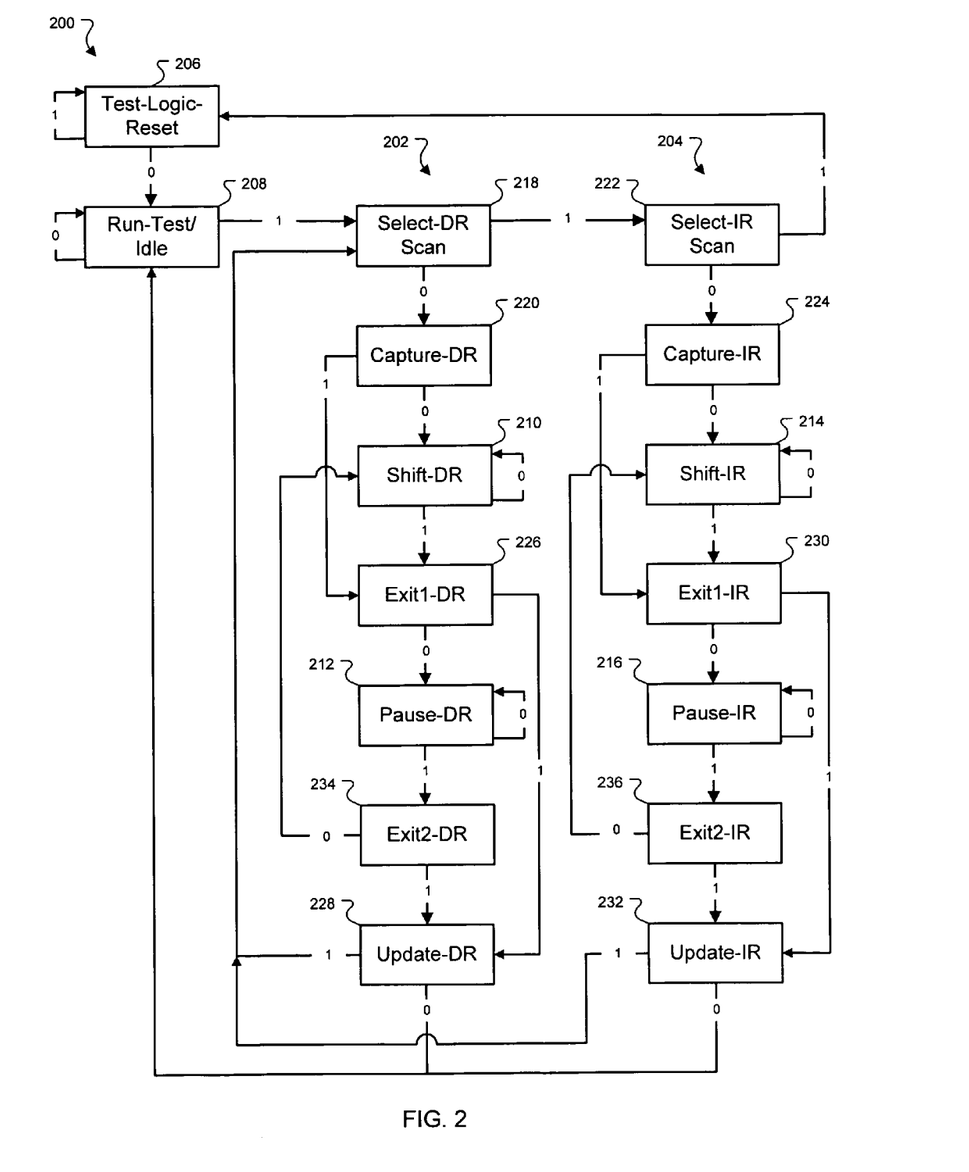
FIG. 2 is a state diagram of the JTAG TAP controller as shown in FIG. 1.

FIG. 2 is a state diagram 200 of the JTAG TAP controller 120, as shown in reference to FIG. 1. The state diagram shows an example state machine, which includes state transitions that are controlled by the TMS signal and driven by the TCK signal. Each state has two exits allowing all transitions to be controlled by the one TMS signal.

Two paths in the state diagram 200 are a data register path 202 and an instruction register path 204. The data register path 202 can include controls for the operations on data registers. The controls can include the boundary scan register (BSR), which is connected between the TDO and TDI signals for input and output. The controls can also include the bypass register, which allows TDI and TDO to be connected to a single bit pass through register for input and output. The data register to be operated on, when the data register path 202 is taken, is selected based on the value loaded in an instruction register. The instruction register path 204 can include controls for operations on an instruction register.

In one implementation, the state machine includes six ready states: Test-Logic-Reset state 206, Run-Test/Idle state 208, Shift-DR state 210, Pause-DR state 212, Shift-IR state 214, and Pause-IR state 216. The Test-Logic-Reset state 206 is the steady state that exists for the condition when TMS is set high (i.e., equal to 1).

At power up or during normal operation of the microcontroller, the JTAG TAP controller 120 is placed into the Test-Logic-Reset state 206 by driving the TMS input high and applying, for example, five or more TCKs. In this state, the JTAG TAP controller 120 issues a reset signal that places all test logic in a condition that does not impede normal operation of the microcontroller. A protocol is applied by way of the TMS input signal and the TCK signal causing the JTAG TAP controller to exit the Test-Logic-Reset state 206 and enter the Run-Test/Idle state 208 when test access is required. An instruction register (IR) scan can be issued to the JTAG TAP controller 120 transitioning it through the instruction register path 204 from the Run-Test/Idle state 208. A data register (DR) scan can also be issued to the JTAG TAP controller 120 transitioning it through the data register path 202 from the Run-Test/Idle state 208.

The states of the data register path 202 and the instruction register path 204, in this example, are mirror images of each other, adding symmetry to the state transitions. The first action that can occur when either path is entered is a capture operation. The data register path 202 is entered though a Select-DR Scan state 218 transitioning to a Capture-DR state 220. The instruction register path is entered by transitions through the Select-DR Scan state 218 and a Select-IR Scan state 220 to a Capture-IR state 224.

For example, an operation can include a transition path through the data register path 202 and instruction register path 204. The operation can load a new data value into the currently selected data register and read back the old data value. The value of the currently selected data register that will be shifted out can be captured upon entry to the Capture-DR state 220. The new value can be shifted into the currently selected data register from the TDI line, for example one bit at a time, upon entries to the Shift-DR state 210. The old value of the currently selected data register can be shifted out to the TDO line, for example one bit at a time, upon exits from the Shift-DR state 210. The JTAG TAP controller 120 transitions to an Exit1-DR state 226 when complete. The value of the currently selected data register can be transferred to the output pins, in the case of the boundary scan register, upon entry to an Update-DR state 228 after exiting the Exit1-DR state 226. The JTAG TAP controller 120 transitions to the Run-Test/Idle state 208 terminating the operation.

The value of the instruction register that will be shifted out can be captured upon entry into the Capture-IR state 224. The old value can be shifted out, for example one bit at a time upon entries to the Shift-IR state 214. In some implementations, the value captured by the shift register in Capture-IR is not the same as the old IR value, but can be a status code, or a fixed value, as defined by the JTAG standard. The new value can be shifted into the instruction register, for example one bit at a time, upon exits to the Shift-IR state 214. The JTAG TAP controller 120 transitions to an Exit1-IR state 230 when complete. The new value shifted into the instruction register can be applied and the instruction takes effect upon entry into an Update-IR state 232. The JTAG TAP controller 120 transitions to the Run-Test/Idle state 208 terminating the operation.

A pause state may be entered to temporarily suspend the shifting of data through either the selected data register, in the case of Pause-DR 212, or the instruction register, in the case of Pause-IR 216. A pause may occur while a required operation, for example refilling a tester memory buffer, is performed. In the case of the data register path 202, shifting can resume from the Pause-DR state 212 by way of an Exit2-DR state 234. Shifting can also be ended by way of the Exit2-DR state 234 and the Update-DR state 228. The Update-DR state 228 then transitions to the Run-Test/Idle state 208. In the case of the instruction register path 204, shifting can resume from the Pause-IR 216 state by way of an Exit2-IR state 236. Shifting can also be ended by way of the Exit2-IR 236 state and the Update-IR state 232. The Update-IR state 232 then transitions to the Run-Test/Idle state 208.

Figure 3:
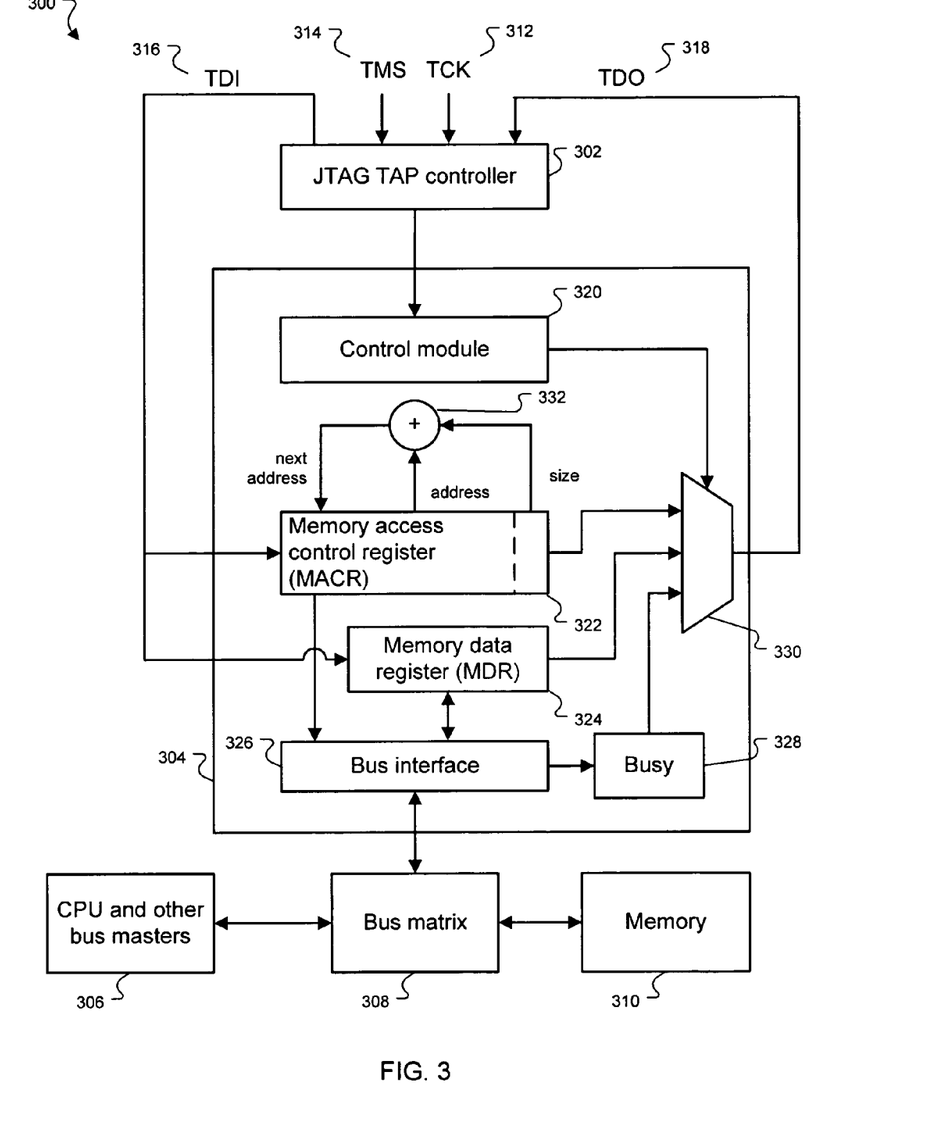
FIG. 3 is a block diagram of an exemplary system used to access memory in a microcontroller.

FIG. 3 is a block diagram of an exemplary system used to access memory in a microcontroller. The memory access system 300 includes a JTAG TAP controller 302, memory access control module 304, a CPU and other bus masters 306, a bus matrix 308 and memory 310.

The JTAG TAP controller 302 can include input pins: test clock input (TCK) 312, test mode select (TMS) 314, test data input (TDI) 316 and test data output (TDO) 318. The TCK 312 can provide the clock input to the boundary scan module of the microcontroller, which controls the access of the boundary scan registers and bus on the microcontroller. The TMS 314 can provide the control signal that determines the transitions of the JTAG TAP controller 302 state machine, as was shown in reference to FIG. 2. TDO 318 can be a serial data output pin, which can provide instruction, test and programming data. TDI 316 can be a serial data input pin, which can provide instruction, test and programming data. The TMS 314, TCK 312 and optionally the TRST (not shown) pins can operate the JTAG TAP controller 302. The TDO 318 and TDI 316 pins can provide a serial path for the data registers.

The CPU and other bus masters 306 can control the access to the memory 310 in the microcontroller. The memory access control module 304 as well as other modules in the microcontroller may access the memory 310. The memory 310 in the microcontroller may include various types of memory devices, which are described in reference to FIG. 1. The CPU and other bus masters 306 control access to the memory 310 by way of a bus matrix 308. The bus matrix 308 can interface to logic components in the microcontroller that require access to the microcontroller bus. The bus matrix 308 can control and prioritize memory accesses within the microcontroller. An example of one of these logic components is the memory access control module 304.

The memory access control module 304 may include a control module 320, a memory access and control register (MACR) 322, a memory data register (MDR) 324, a bus interface 326, a busy register 328 and a summing module 330. The memory access control module 304 may also include a sequential access control module 332. The memory access control module 304 can control read and write operations to the memory 310. The operations are performed during transitions of the JTAG state machine, as described in FIG. 2. The MACR 322, the MDR 324 and the busy register 328 are data registers that can be operated on by the JTAG TAP controller state machine. The transitions can occur in the data register path 202.

In one embodiment, a vendor-defined MEMORY_ACCESS instruction can alternately select the MACR 322 and the MDR 324. The MACR 322 can contain address and control information for the memory access. The MDR 324 can contain the data that is needed for or is a result of the memory access.

In another embodiment, a vendor defined MEMORY_BLOCK_ACCESS instruction can also alternately select the MACR 322 and the MDR 324. The MACR 322 associated with this instruction can contain address and control information for the memory access. In this implementation, the control information may include a size field that can indicate the byte size of the memory locations accessed. The MDR 324 can contain the data that is needed for or is a result of the memory access.

A JTAG reset, described in reference to FIG. 2, can configure the memory access system 300 to accept the vendor-defined instruction, MEMORY_ACCESS, ensuring selection of the MACR 322 by default as the first register to be accessed. When the MEMORY_ACCESS instruction is loaded into the JTAG master, the JTAG TAP controller 302 can enter into the Select-DR scan state selecting the MACR 322. The transition to the Capture-DR state captures the busy register 328.

The busy register 328 may indicate if a memory access is in progress. The busy register 328 may contain a BUSY bit flag which, if set (e.g., equal to one), indicates that a memory access is in progress by the memory access control module 304. If the BUSY bit flag is not set (e.g., equal to zero), no memory access is occurring in the memory access control module 304. The BUSY bit flag in the busy register may be used as a feedback control. This feedback control may allow for continuous memory accesses without concern for address or data corruption.

If there are no memory accesses in progress, the JTAG TAP controller state machine transitions to the Shift-DR state. In this state, the address of the memory location to be accessed is shifted into the MACR 322 from TDI 316. A read/write (R/W) bit flag may be included in the MACR 322 indicating if data is to be read from or written to the memory location whose address may also be contained in the MACR 322. The address and control information in the MACR 322 can be synchronized to the internal clock of the microcontroller. Once all of the data from TDI 316 is shifted into the MACR 322 it can be sent to the bus interface 326. The bus interface 326 can provide an interface between the memory access control module 304 and the microcontroller bus by way of the bus matrix 308. The bus matrix 308 can control the access of the memory access control module 304 to the memory 310.

The JTAG TAP controller state machine can then transition to the Update-DR state. When this occurs, the MDR 324 is selected. In the case of a memory read, the read data can be loaded into the MDR 324 during this state. However, the data will not be scanned out and therefore will not be available on TDO 318. Also during this state, the busy register 328 data can be scanned out. The control module 320, having knowledge of the memory access type, can control the output of the summing module 330 to send the busy register 328 contents to the TDO 318 input pin of the JTAG TAP controller 302. The JTAG master observes the value of TDO 318. The JTAG master may then send another MEMORY_ACCESS instruction to the JTAG TAP controller 302. In the case of a write operation, this instruction will contain the data to write.

The MEMORY_ACCESS instruction will cause the JTAG TAP controller 302 to enter the Capture-DR state where the busy register 328 will be captured. If there is not another memory access in progress, the JTAG TAP controller state machine transitions to the Shift-DR state. If a write access is requested, the write data will be scanned into the MDR 324 from TDI 316 during this state. The write operation will occur when the JTAG TAP controller enters the Update-DR state. In this state, the contents of the MDR 324 will be transferred to the memory 310 by way of the bus interface 326 and the bus matrix 308. The MACR 322 is then selected and the memory access for that address is complete. The control module 320 enables the busy register 328 to be scanned out on TDO 318. The JTAG master can observe the value of the BUSY bit flag in the busy register 328 returned on TDO 318 and determine if the memory access operation is complete. If complete, another MEMORY_ACCESS instruction sequence may be initiated in order to read or write data to another memory location.

In the case of a read access, TDI 316 is not scanned into MDR 324 during the Shift-DR state. The JTAG TAP controller state machine then transitions to the Update-DR state. In this state, the contents of the MDR 324 will be scanned out to the summation block 330. The control module 320 by way of the summation block 330 can combine the output data from the memory in the MDR 324 with the BUSY bit flag from the busy register 328. The control module 320 then enables this combined data value to be scanned out on TDO 318. The JTAG master can observe the value of the BUSY bit flag in the busy register 328 returned on TDO 318 and determine if the memory access operation is complete. If the operation is complete, the JTAG master can then store the returned data value read from the specific memory location. Another MEMORY_ACCESS instruction sequence may be initiated in order to read or write data to another memory location.

In another implementation, the MEMORY_BLOCK_ACCESS instruction is loaded into the JTAG master. The JTAG TAP controller 302 can then enter into the Select-DR scan state selecting the MACR 322. The transition to the Capture-DR state captures the busy register 328. If there are no memory accesses in progress, the JTAG TAP controller state machine transitions to the Shift-DR state. In this state, the address of the memory location to be accessed is shifted into the MACR 322 from TDI 316. The R/W bit flag may be included in the MACR 322 indicating if data is to be read from or written to the memory location whose address may also be contained in the MACR 322. The size field may be included in the MACR 322 indicating the byte width of the address of the memory location to be used in the memory access. The address and control information in the MACR 322 can be synchronized to the internal clock of the microcontroller. Once all of the data from TDI 316 is shifted into the MACR 322 it can be sent to the bus interface 326.

The JTAG TAP controller state machine can then transition to the Update-DR state. When this occurs, the MDR 324 is selected. In the case of a memory read, the read data can be loaded into the MDR 324 during this state. However, the data will not be scanned out and therefore will not be available on TDO 318. Also during this state, the busy register 328 data can be scanned out. The control module 320, having knowledge of the memory access type, can control the output of the summing module 330 to send the busy register 328 contents to the TDO 318 input pin of the JTAG TAP controller 302. The JTAG master observes the value of TDO 318.

In this implementation, the JTAG master may then send a MEMORY_BLOCK_ACCESS instruction to the JTAG TAP controller 302. In the case of a write operation, this instruction will contain the data to write.

The MEMORY_BLOCK_ACCESS instruction will cause the JTAG TAP controller 302 to enter the Capture-DR state where the busy register 328 will be captured. If there is not another memory access in progress, the JTAG TAP controller state machine transitions to the Shift-DR state. If a write access is requested, the write data will be scanned into the MDR 324 from TDI 316 during this state. The write operation will occur when the JTAG TAP controller enters the Update-DR state. In this state, the contents of the MDR 324 will be transferred to the memory 310 by way of the bus interface 326 and the bus matrix 308. When the Update-DR state is entered, the sequential access control module 332 can increment the address contained in the MACR 322 according to the size field in the MACR 322. The address in the MACR 322 reflects the next sequential address of a block of memory that may be accessed. Another MEMORY_BLOCK_ACCESS instruction may be sent to the JTAG TAP controller 302 by the JTAG master. The next sequential address in the block of memory will be accessed for the operation indicated by the R/W bit flag previously stored in the MACR 322. MEMORY_BLOCK_ACCESS instructions can be continuously sent for writing sequential blocks of memory in the microcontroller.

The control module 320 enables the busy register 328 to be scanned out on TDO 318. The JTAG master can observe the value of the BUSY bit flag in the busy register 328 returned on TDO 318 and determine if the memory access operation is complete. If complete, another MEMORY_BLOCK_ACCESS instruction may be initiated in order to read or write data to another memory location.

In the case of a read access, TDI 316 is not scanned into MDR 324 during the Shift-DR state. The JTAG TAP controller state machine then transitions to the Update-DR state. In this state, the contents of the MDR 324 will be scanned out to the summation block 330. When the Update-DR state is entered, the sequential access control module 332 can increment the address contained in the MACR 322 according to the size field in the MACR 322. The control module 320 by way of the summation block 330 can combine the output data from the memory in the MDR 324 with the BUSY bit flag from the busy register 328. The control module 320 then enables this combined data value to be scanned out on TDO 318. The JTAG master can observe the value of the BUSY bit flag in the busy register 328 returned on TDO 318 and determine if the memory access operation is complete. If the operation is complete, the JTAG master can then store the returned data value read from the specific memory location. Another MEMORY_BLOCK_ACCESS instruction may be sent in order to read another memory location.

Figure 4:
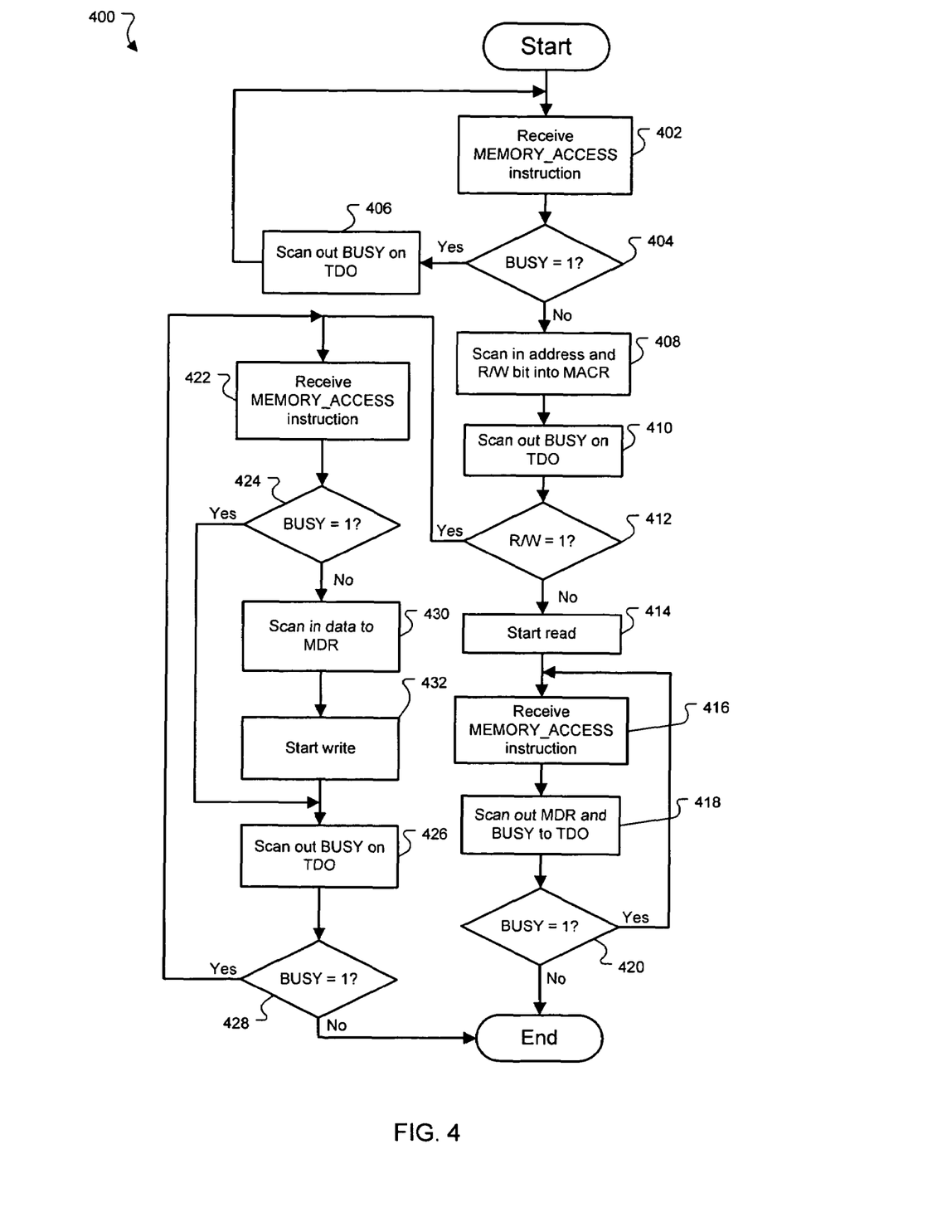
FIG. 4 is a flowchart of an exemplary method for accessing memory in a microcontroller.

FIG. 4 is a flowchart of an exemplary method for accessing memory in a microcontroller. The memory access method 400 starts when the JTAG TAP controller 302, as described in reference to FIG. 3, receives the vendor defined JTAG instruction, MEMORY_ACCESS (step 402). For example, the instruction can be received from the JTAG master 108, as described in reference to FIG. 1. This instruction is implemented in the memory access control module 304, as shown with reference to FIG. 3. The start of the memory access method 400 can result in the selection of the MACR 322. The JTAG TAP controller state machine can then transition down the data register path 202, as shown in reference to FIG. 2. The first state it can transition into is the Capture-DR state. In this state, the busy register 328 can be captured. If, in step 404, the BUSY bit flag in the busy register 328 is set (e.g., equal to one), the value is scanned out on TDO 318 in step 406. The BUSY bit flag being set indicates that the memory access control module 304 is in the process of another memory access. The memory access method 400 proceeds to step 402 to receive another MEMORY_ACCESS instruction. The memory access method 400 will continue to perform these operations until the BUSY bit flag in the busy register 328 indicates that the memory access control module 304 is available for another memory access.

If, in step 404, the BUSY bit flag is not equal to one, the JTAG TAP controller state machine transitions to the Shift-DR state. During this state, in step 408, the data on TDI 316 is scanned into the MACR 322. The data may include a memory address to be accessed within the microcontroller and the R/W bit flag indicating if the address to be accessed can be read from or written to. The JTAG TAP controller state machine next transitions to the Update-DR state by way of the Exit1-DR state. During this state, in step 410, the busy register 328 can be scanned out on TDO 318 by way of summation block 330 under the control of the control module 320. However, the busy register 328 will have the BUSY bit flag not set (e.g., equal to zero) as it was captured in step 404. In step 404, if the BUSY bit flag was set (e.g., equal to one) the memory access method 400 proceeded to step 402 to receive another MEMORY_ACCESS instruction. Therefore, though this step 410 occurs within the memory access method 400, the JTAG master may choose not to observe the value of TDO 318 at this point in the memory access method.

The R/W bit flag in the MACR 322 indicates if a read or write access is to occur. If the R/W bit flag is set (e.g., equal to one), a write access will occur. If the flag is not set (e.g., equal to zero) a read access will occur. Step 412 determines the value of the R/W bit flag. If, in step 412, the R/W bit flag is not set (e.g., equal to zero), a read access will occur and the memory access method 400 proceeds to step 414.

The JTAG TAP controller state machine, in the Update-DR state, reads the data from the memory 310 into the MDR 324 by way of the bus matrix 308 and bus interface 326. During this state, the MDR 324 is selected for the next pass through the data register path 202 of the JTAG TAP controller state machine.

Next, in step 416, a MEMORY_ACCESS instruction is received by the JTAG TAP controller 302. The JTAG TAP controller state machine transitions to the Capture-DR state and the busy register 328 is captured. The JTAG TAP controller then transitions to the Shift-DR state where, in the case of a read access, TDI 316 is not scanned into the MDR 324. The JTAG TAP controller state machine then transitions to the Update-DR state. In this state, the contents of the MDR 324 will be scanned out to the summation block 330. The control module 320 by way of the summation block 330 can combine the output data from the memory in the MDR 324 with the BUSY bit flag from the busy register 328. The control module 320 then enables this combined data value to be scanned out on TDO 318 in step 418. The JTAG master can observe the value of the BUSY bit flag and determine if the memory access is complete. If, in step 420, it is determined that the BUSY bit flag is set (e.g., equal to one), indicating the memory access is not complete, the memory access method proceeds to step 416 where it can receive another MEMORY_ACCESS instruction. The memory access method 400 will continue to perform these operations until the BUSY bit flag in the busy register is not set (e.g., equal to zero). This will indicate that the memory location addressed can be accessed for reading. If it is determined, in step 420, that the BUSY bit flag is not set (e.g., equal to zero) then the memory access control module 304 contains the valid data value read from the memory in the MDR 324. The memory access method 400 selects the MACR 322 and terminates. While the BUSY bit flag is equal to one, the JTAG master can ignore the memory data scanned out on TDO 318.

If, in step 412, the R/W bit flag is set (e.g., equal to one), a write access will occur and the memory access method 400 proceeds to step 422. The JTAG TAP controller state machine, in the Update-DR state, selects the MDR 324 register for the next pass through the data register path 202 of the JTAG TAP controller state machine.

Next, in step 422, a MEMORY_ACCESS instruction is received by the JTAG TAP controller 302. The JTAG TAP controller state machine transitions to the Capture-DR state and the busy register 328 is captured. If it is determined, in step 424, that the BUSY bit flag of the busy register 328 is set (e.g., equal to one), write data is not scanned into the MDR 324 as another memory access is in progress. The memory access method 400 proceeds to step 426. In step 426, the busy register 328 is scanned out by way of summation block 330 under the control of the control module 320 to TDO 318. Step 428 determines that the BUSY bit flag is set (e.g., equal to one) and the memory access method 400 proceeds to step 422. The memory access method 400 will continue to perform these operations until the BUSY bit flag is not set (e.g., equal to zero). The not set condition will indicate that the memory location addressed can be accessed for writing.

If the BUSY bit flag is not set (e.g., equal to zero), in step 424, the JTAG TAP controller then transitions to the Shift-DR state where, in the case of a write access, the data to be written is scanned into the MDR 324 from TDI 316 in step 430. The JTAG TAP controller state machine then transitions to the Update-DR state where, in step 432, the contents of the MDR 324 will be transferred to the memory 310 by way of the bus interface 326 and the bus matrix 308 to the memory 310. Also the busy register 328 is scanned out on TDO 318 by way of the summation block 330 under the control of the control module 320, in step 426. In step 428, it is determined that the BUSY bit flag is not set (e.g., equal to zero). The memory access method 400 selects the MACR 322 and terminates.

Figure 5:
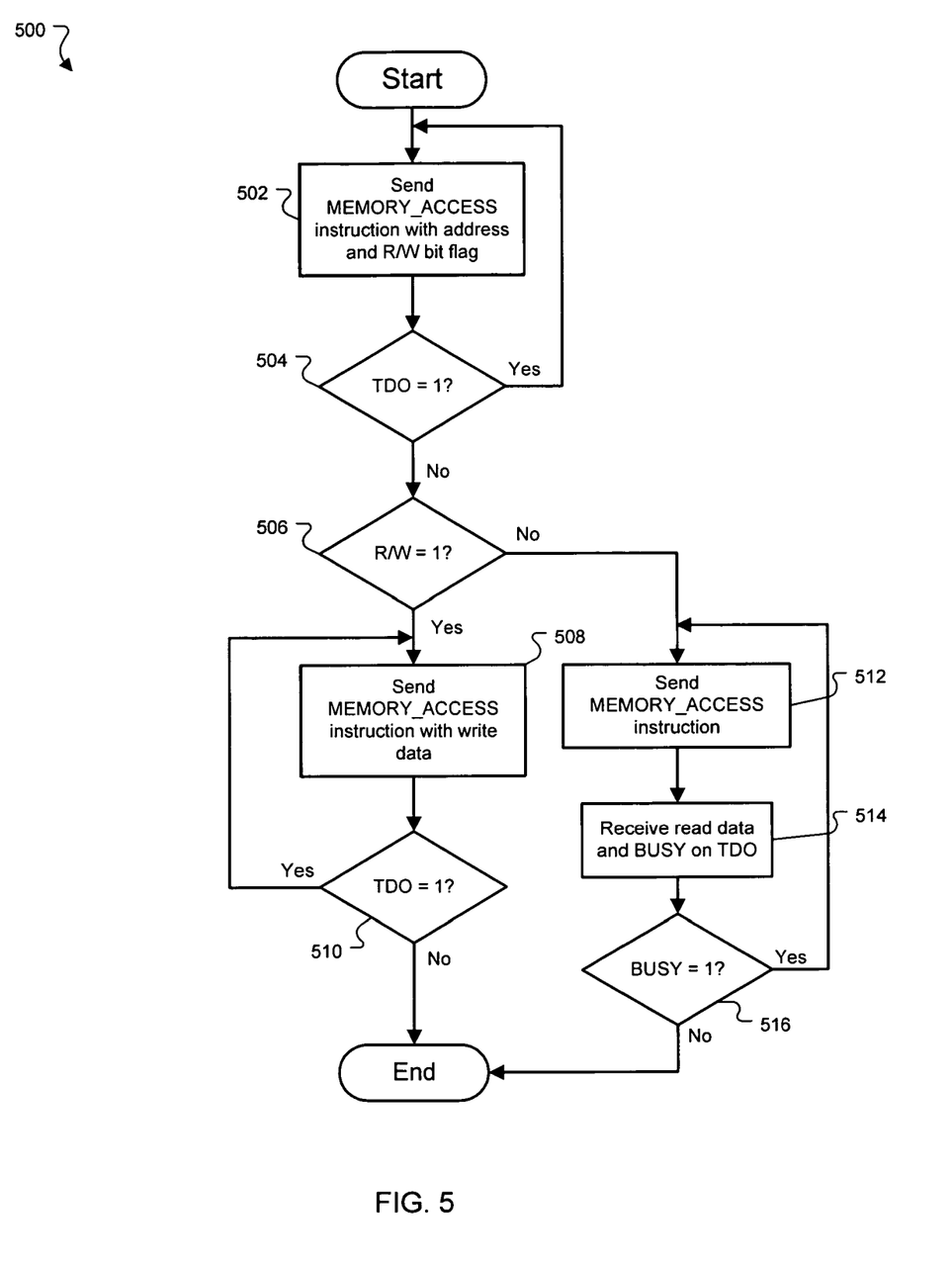
FIG. 5 is a flow chart of an exemplary method in the JTAG master for accessing the memory of a microcontroller.

FIG. 5 is a flow chart of an exemplary method 500 in the JTAG master 108 for accessing the memory of a microcontroller. The method 500 may start with, for example, a user on user device 112 entering a command into the host computer 102, by way of the user device keyboard, initiating a memory access process whose method was described in reference to FIG. 4. The JTAG master sends the MEMORY_ACCESS instruction to the JTAG TAP controller 302 in step 502. This instruction may include the address of the memory location to be accessed as well as the R/W bit flag indicating if the access is to be a memory read or memory write. The JTAG master observes the value of TDO 318 received from the JTAG TAP controller 302 in step 504. If TDO is equal to 1, in step 504, the memory access control module 304, in reference to FIG. 3, cannot begin a new memory access sequence. Therefore, the method 500 proceeds to step 502. If, however, TDO is not set (e.g., equal to zero), in step 504, the method 500 can continue to step 506.

Step 506 determines if the memory access is a read or a write access. If the R/W bit flag is set (e.g., equal to one), a memory write access can occur and the method 500 can proceed to step 508. The JTAG master sends a MEMORY_ACCESS instruction to the JTAG TAP controller 302 that contains the data to be written to the memory. The JTAG master then observes the value of TDO 318. If TDO is set (e.g., equal to one), in step 510, the memory access control module 304 is not ready to accept the data to be written to the memory location. The method 500 will then proceed to step 508. The JTAG master sends the MEMORY_ACCESS instruction to the JTAG TAP controller again, containing the data to be written to memory. If, in step 510, TDO is not set (e.g., equal to zero), the memory write was completed and the method 500 is ended.

If step 506 determined, by R/W bit flag being not set (e.g., equal to zero), that a memory read access is to occur, the method 500 proceeds to step 512. The JTAG master sends a MEMORY_ACCESS instruction to the JTAG TAP controller 302. In step 514, the JTAG master receives the read data and the BUSY bit flag on TDO. The JTAG master observes the value of the BUSY bit flag. If the BUSY bit flag is set (e.g., equal to 1), in step 516, the memory access control module 304 did not read the data from the addressed memory location. The JTAG master may ignore the data received and the method 500 proceeds to step 512 where the JTAG master resends the MEMORY_ACCESS instruction. If, however, in step 516 the BUSY bit flag is not set (e.g., equal to zero), the data was read from the memory location and returned to the JTAG master. The method 500 ends.

Figure 6:
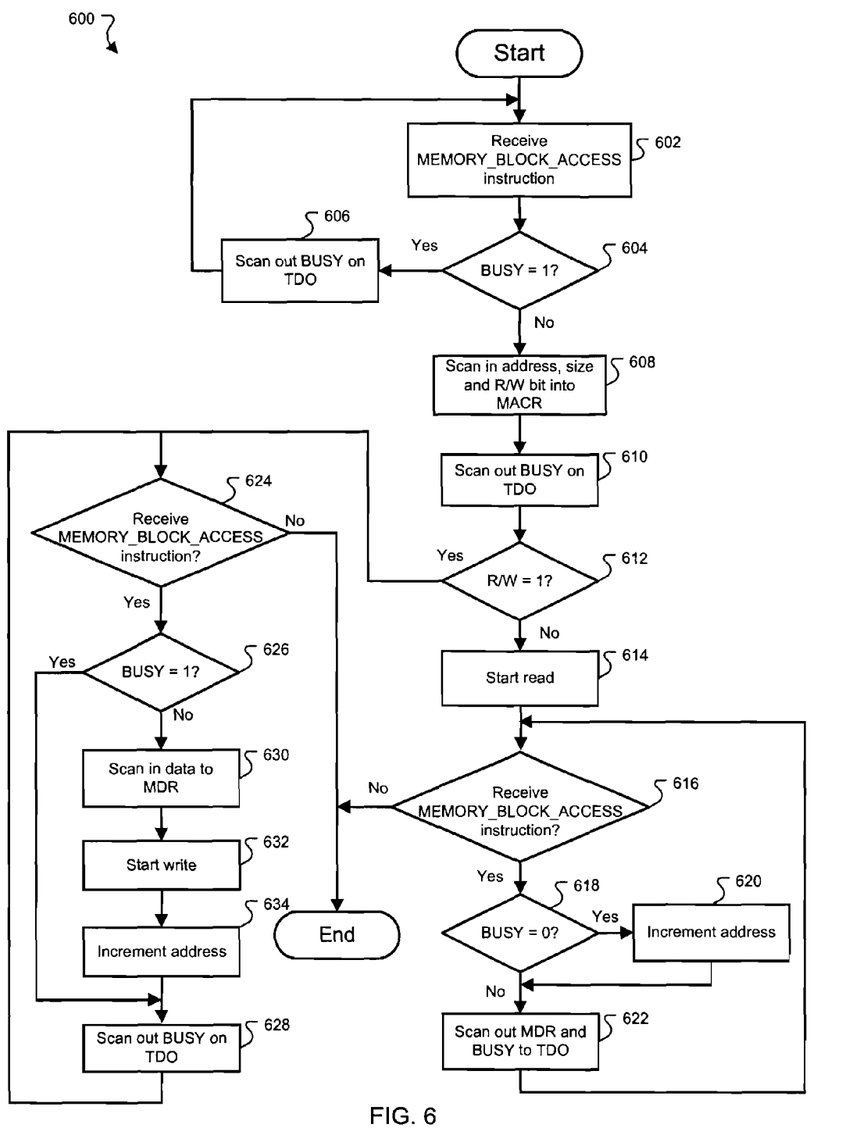
FIG. 6 is a flowchart of an exemplary method for accessing sequential memory in a microcontroller.

FIG. 6 is a flowchart of an exemplary method for accessing sequential memory in a microcontroller. The sequential memory access method 600 starts when the JTAG TAP controller 302, as described in reference to FIG. 3, receives the vendor defined JTAG instruction, MEMORY_BLOCK_ACCESS (step 602). For example, the instruction can be received from the JTAG master 108, as described in reference to FIG. 1. This instruction is implemented in the memory access control module 304, as shown with reference to FIG. 3. The start of the sequential memory access method 600 can result in the selection of the MACR 322. The JTAG TAP controller state machine can then transition down the data register path 202, as shown in reference to FIG. 2. The first state it can transition into is the Capture-DR state. In this state, the busy register 328 can be captured. If, in step 604, the BUSY bit flag in the busy register 328 is set (e.g., equal to one), the value is scanned out on TDO 318 in step 606. The BUSY bit flag being set indicates that the memory access control module 304 is in the process of another memory access. The memory access method 600 proceeds to step 602 to receive another MEMORY_BLOCK_ACCESS instruction. The memory access method 600 will continue to perform these operations until the BUSY bit flag in the busy register indicates that the memory access control module 304 is available for another memory access.

If, in step 604, the BUSY bit flag is not set (e.g., equal to zero), the JTAG TAP controller state machine transitions to the Shift-DR state. During this state, in step 608, the data on TDI 316 is scanned into the MACR 322. The data may include a memory address to be accessed within the microcontroller and the R/W bit flag indicating if the address to be accessed can be read from or written to. The data may also include the size field which indicates the byte width of the address in the MACR 322. The JTAG TAP controller state machine next transitions to the Update-DR state by way of the Exit1-DR state. During this state, in step 610, the busy register 328 can be scanned out on TDO 318 by way of summation block 330 under the control of the control module 320. However, the busy register 328 will have the BUSY bit flag not set (e.g., equal to zero) as it was captured in step 604. In step 604, if the BUSY bit flag was set (e.g., equal to one) the sequential memory access method 600 proceeded to step 602 to receive another MEMORY_BLOCK_ACCESS instruction. Therefore, though this step 610 occurs within the sequential memory access method 600, the JTAG master may choose not to observe the value of TDO 318 at this point in the sequential memory access method.

The R/W bit flag in the MACR 322 indicates if a read or write access is to occur. If the R/W bit flag is set (e.g., equal to one), a write access will occur. If it is not set (e.g., equal to zero) a read access will occur. Step 612 determines the value of the R/W bit flag. If, in step 612, the R/W bit flag is not set (e.g., equal to zero), a read access will occur and the memory access method 600 proceeds to step 614.

The JTAG TAP controller state machine, in the Update-DR state, reads the data from the memory 310 into the MDR 324 by way of the bus matrix 308 and bus interface 326. During this state, the MDR 324 register is selected for the next pass through the data register path 202 of the JTAG TAP controller state machine.

Next, in step 616, it is determined if a MEMORY_BLOCK_ACCESS instruction has been received by the JTAG TAP controller 302. If the instruction has been received, the JTAG TAP controller state machine transitions to the Capture-DR state and the busy register 328 is captured. The JTAG TAP controller then transitions to the Shift-DR state where, in the case of a read access, TDI 316 is not scanned into the MDR 324. The JTAG TAP controller state machine then transitions to the Update-DR state. When the Update-DR state is entered, if the BUSY bit flag in the busy register is not set (e.g., equal to zero), in step 618, the sequential access control module 332 can increment the address contained in the MACR 322 according to the size field in the MACR 322 in step 620. If the BUSY bit flag is set (e.g., equal to one), the address will not be incremented. The data has not been successfully read so the instruction should be repeated. The sequential memory access method will proceed to step 622.

Also in this state, the contents of the MDR 324 will be scanned out to the summation block 330. The control module 320 by way of the summation block 330 can combine the output data from the memory in the MDR 324 with the BUSY bit flag from the busy register 328. The control module 320 then enables this combined data value to be scanned out on TDO 318 in step 622. The JTAG master can observe the value of the BUSY bit flag and determine if the memory access was successful. The sequential memory access process 600 can then proceed to step 616 to receive another MEMORY_BLOCK_ACCESS instruction. If the previous instruction did not complete, the JTAG master may send the same data with the MEMORY_BLOCK_ACCESS instruction for a repeat of the read. If the previous instruction was successful, the JTAG master may send the data for the next sequential access of the memory.

If, in step 616, a MEMORY_BLOCK_ACCESS instruction is not received, the sequential memory access method 600 is terminated.

If, in step 612, the R/W bit flag is set (e.g., equal to one), a write access will occur and the sequential memory access method 600 proceeds to step 624. The JTAG TAP controller state machine, in the Update-DR state, selects the MDR 324 register for the next pass through the data register path 202 of the JTAG TAP controller state machine.

Next, in step 624, a MEMORY_BLOCK_ACCESS instruction is received by the JTAG TAP controller 302. The JTAG TAP controller state machine transitions to the Capture-DR state and the busy register 328 is captured. If it is determined, in step 626, that the BUSY bit flag of the busy register 328 is set (e.g., equal to one), write data is not scanned into the MDR 324 as another memory access is in progress. Also the address in the MACR 322 is not incremented. The sequential memory access method 600 proceeds to step 628. In step 628, the busy register 328 is scanned out by way of summation block 330 under the control of the control module 320 to TDO 318. Step 628 determines that the BUSY bit flag is set (e.g., equal to one) and the sequential memory access method 600 proceeds to step 624. The sequential memory access method 600 will continue to perform these operations until the BUSY bit flag is not set (e.g., equal to zero). This will indicate that the memory location addressed can be accessed for writing.

If the BUSY bit flag is not set (e.g., equal to zero), in step 626, the JTAG TAP controller then transitions to the Shift-DR state where, in the case of a write access, the data to be written is scanned into the MDR 324 from TDI 316 in step 630. The JTAG TAP controller state machine then transitions to the Update-DR state where, in step 632, the contents of the MDR 324 will be transferred to the memory 310 by way of the bus interface 326 and the bus matrix 308 to the memory 310. When the Update-DR state is entered the sequential access control module 332 can increment the address contained in the MACR 322 according to the size field in the MACR 322 in step 634. Also the busy register 328 is scanned out on TDO 318 by way of the summation block 330 under the control of the control module 320 in step 628. The sequential memory access method 600 can then proceed to step 624.

If, in step 624, a MEMORY_BLOCK_ACCESS instruction is not received, the sequential memory access method 600 is terminated.

Figure 7:
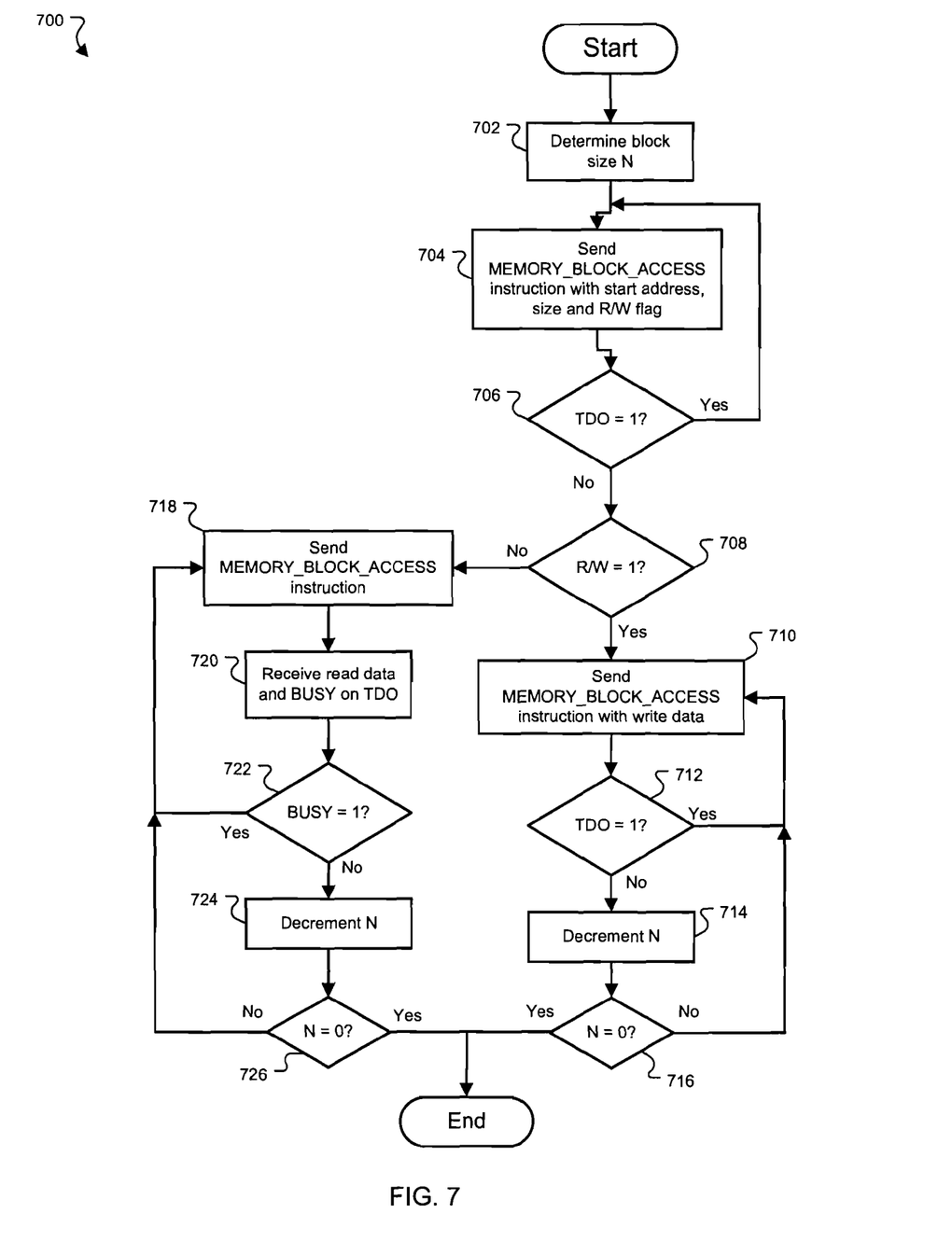
FIG. 7 is a flow chart of an exemplary method in the JTAG master for accessing the memory of a microcontroller sequentially.

FIG. 7 is a flow chart of an exemplary method in the JTAG master 108, as shown in reference to FIG. 1, for sequentially accessing the memory of a microcontroller. The method 700 may start with, for example, a user on user device 112 entering a command into the host computer 102, by way of the user device keyboard, initiating a sequential memory access process whose method was described in reference to FIG. 6. The JTAG master can determine a block size, N, of the memory to be sequentially accessed in step 702. The block size, N, is the number of sequential memory locations to be read from or written to by the JTAG master. This value may be, for example, entered by the user by way of user device 112. In another example, the block size, N, may be hardcoded in the JTAG master 108.

The JTAG master sends the MEMORY_BLOCK_ACCESS instruction to the JTAG TAP controller 302, in step 704. The instruction may include a memory address to be accessed within the microcontroller and the R/W bit flag indicating if the address to be accessed can be read from or written to. The data may also include the size field which indicates the byte width of the address in the MACR 322. If TDO is set (e.g., equal to 1), in step 706, the memory access control module 304, in reference to FIG. 3, cannot begin a new memory access sequence. Therefore, the method 700 returns to step 704. If, however, TDO is not set (e.g., equal to zero), in step 706, the method 700 can continue to step 708.

Step 708 determines if the memory access is a read or a write. If the R/W bit flag is set (e.g., equal to one), a memory write access can occur and the method 700 can proceed to step 710. The JTAG master sends a MEMORY_BLOCK_ACCESS instruction to the JTAG TAP controller 302 that contains the data to be written to the memory. The JTAG master then observes the value of TDO 318. IF TDO is set (e.g., equal to one), in step 712, the memory access control module 304 is not ready to accept the data to be written to the memory location. The method 700 will then proceed to step 710. The JTAG master sends the MEMORY_BLOCK_ACCESS instruction to the JTAG TAP controller again, containing the data to be written to memory. If, in step 712, TDO is not set (e.g., equal to one), the memory write was completed. The JTAG master, in step 714, decrements the block size, N. In step 716, if N is not equal to zero, the method 700 proceeds to step 710. The JTAG master, in block accessing sequential data in the microcontroller, may do so either as a block of read or write accesses. If in step 716, N is equal to zero, the method 700 is ended.

If, in step 708, it is determined that the R/W bit flag was not set (e.g., not equal to one), then a read access will occur. The method 700 proceeds to step 718. The JTAG master sends a MEMORY_BLOCK_ACCESS instruction to the JTAG TAP controller 302. In step 720, the JTAG master receives the read data and the BUSY bit flag on TDO. The JTAG master observes the value of the BUSY bit flag. If the BUSY bit flag is set (e.g., equal to one), in step 722, the memory access control module 304 did not read the data from the addressed memory location. The JTAG master may ignore the data received and the method 700 proceeds to step 718. If, however, in step 722 the BUSY bit flag is not set (e.g., not equal to one), the data was read from the memory location and returned to the JTAG master. The JTAG master, in step 724, decrements the block size, N. In step 726, if N is not equal to zero, the method 700 proceeds to step 718. If in step 726, N is equal to zero, the method 700 is ended.

In one implementation of the memory access system 300, the memory access initiated in the Update-DR is completed by the time the Capture-DR is entered the next time when either a MEMORY_ACCESS instruction or a MEMORY_BLOCK_ACCESS instruction is received. Capture-DR can occur, for example, at least three TCK cycles after the Update-DR. The memory access is controlled by the CPU and other masters 306, and is measured by internal clock cycles. The internal clock may be faster that the TCK allowing the memory access to complete within the three JTAG TCK cycles.

In another implementation of the memory access system 300, the memory access is not completed within the three JTAG TCK cycles. The JTAG master may insert idle cycles into the memory access system 300 by entering the Run-Test/Idle state of the JTAG TAP Controller state machine for as long as needed. The number of idle cycles can be entered into the JTAG master, for example, by a user entering a value by way of user device 112 which will be sent to the JTAG master by way of input/output 114 to input/output 110. The number of idle cycles can be determined by a user with respect to access latency for the memory on the microcontroller board.

In another implementation of the memory access system 300, access latency may vary or be unknown. Therefore, a feedback mechanism may be used to provide the JTAG master with status information for the memory access. The busy register 328 and the BUSY bit flag can provide this feedback to the JTAG master allowing it to monitor a memory access to completion before beginning another. The feedback can be beneficial when accessing cached memory, which may need to be accessed from a slower system bus. It may also be beneficial when accessing the microcontroller system bus if accessing internal memory that may be shared with an on-chip bus master, an example of which is shown in FIG. 3. The bus master may have higher priority, causing occasional long latency.

In another implementation, the memory access system may be directly connected to the memory through a dedicated bus. This dedicated bus, for example, may include a DMA controller. This may allow for increased throughput for memory accesses by reducing latency.

Another implementation may include the use of other full-duplex serial communication protocols. These protocols may include RS-485, Ethernet 802.3, or a proprietary full-duplex serial communication protocol. The control logic for the memory access operations can be contained in a module on the microcontroller board that may directly interface to the serial communication port.

In an implementation, the size field used by a MACR may be hardcoded in the memory access control module. This can allow the number of bits sent to the memory access control module on TDI, for example, to be decreased resulting in less time to scan in the address information to the MACR.

Another implementation may include a block of registers at the output of the MACR 322 and the MDR 324 data registers. The block of registers may buffer the data that is output from these registers. The busy register may control the sending of the data back to the JTAG master only when valid data is available. Memory accesses can then occur at a rate independent of the rate at which the data is sent back to the JTAG master. Also the JTAG master would have no need to observe a BUSY bit for status information. It may assume that all data received back is valid.

A number of embodiments of the invention have been described. Nevertheless, it will be understood that various modifications may be made without departing from the spirit and scope of the invention. Accordingly, other embodiments are within the scope of the following claims.

What is claimed is:

1. A method for executing a sequential data memory access through a serial access port coupled to a test device, the method comprising:
   a) receiving at the serial access port a command from the test device to access a block of sequential data elements in a memory array of a device under test and a start address value associated with the block, the command comprising an increment value;
   b) accessing a data element in the block at an address having the start address value, and outputting the accessed data element to the serial access port;
   c) incrementing the address by the increment value;
   d) accessing an additional data element in the block at the incremented address, and outputting the additional data element to the serial access port;
   e) performing c) and d) for each of any remaining data elements in the block of sequential data elements; and
   f) receiving an additional command from the test device and executing said additional command to test a logic component of the device under test other than the memory array while (b), (c), (d) and (e) are performed.

2. The method of claim 1, further comprising generating a signal to indicate that an access of the memory array is completed.

3. The method of claim 2, further comprising, in response to the signal, accessing a next block of sequential data according to the method of claim 1.

4. The method of claim 1, where the command comprises the start address value.

5. The method of claim 1, further comprising transmitting a status signal to the test device indicating whether the sequential accessing is complete.

6. The method of claim 5, further comprising receiving a subsequent access command from the test device upon a transition in the status signal.

7. The method of claim 1, where the serial access port is part of a JTAG interface.

8. The method of claim 1, where the device under test comprises an embedded controller.

9. The method of claim 1, where the data element comprises a nibble, byte, half word, or word.

10. The method of claim 1, where the serial access port is full-duplex.

11. The method of claim 1, where substantially an entire data block, comprising multiple data elements in the memory array that are each accessed in at least one operation within the device under test, is accessed through the serial access port upon the receipt of a single block-access command from the test device.

12. A system for executing a sequential data memory access through a serial access port comprising:
   a test device to transmit a block access command specifying a start address and an increment value to an embedded device under test; and
   a memory access controller to receive the block access command and successively access data elements in the block of a memory array of the embedded device, the memory access controller operable to sequentially access the data at the start address, increment the address by the increment value, sequentially access data at the incremented address, and repeat the incrementing and accessing for each remaining data element in the block,
   wherein the serial access port is configured to receive and execute a command to test a logic component of the embedded device other than the memory array while the memory access controller is executing the block access command.

13. The system of claim 12, further comprising a signal generated by the memory access controller to indicate that a memory access is completed.

14. The system of claim 13, where the memory access controller is operable to sequentially access a next block of sequential data in response to the signal.

15. The system of claim 12, further comprising a status signal transmitted to the test device by the memory access controller indicating whether the sequential accessing is complete.

16. The system of claim 15, where the test device is operable to transmit a subsequent access command to the memory access controller upon a transition in the status signal.

17. The system of claim 12, where the increment value is user-specified.

18. The system of claim 12, where substantially an entire data block is accessed upon the receipt of a single command from the test device.

19. An embedded controller device comprising:
   a memory array;
   a controller core that executes instructions in the memory array;
   a serial access port configured to receive commands for testing the memory array and the controller core from a test system that is external to the device; and
   a memory array controller coupled to the serial access port and configured to (a) receive a block access command from the test system, through the serial access port, that specifies a start address value associated with a block of sequential data elements in the memory array to be accessed, and an increment value; (b) access a data element in the memory array at an address having the start address value; (c) increment the address by the increment value and access a data element in the memory array at the incremented address; and (d) perform (c) for each of any remaining data elements in the block of sequential data elements,
   wherein the serial access port is configured to receive and execute a command to test a logic component of the device other than the memory array while the memory array controller is performing (b), (c) and (d) to execute the block access command.

20. The device of claim 19, wherein the memory array controller is configured to receive a single block access command and perform (b), (c) and (d) based on the single block access command, without receiving any additional commands.

21. The device of claim 19, wherein the memory array controller is configured to receive a block access command that comprises either a block read command or a block write command.

22. The device of claim 19, wherein the memory array controller is configured to receive a block access command comprising a block size that specifies a size of the block of sequential data elements.

23. The device of claim 19, wherein the memory array controller is configured to generate a busy signal while performing (b) and (c).

* * * * *